United States Patent [19]

Rosebrock

[11] Patent Number: 4,849,758

[45] Date of Patent: Jul. 18, 1989

[54] SYSTEM FOR TRANSMITTING OR STORING INPUT SIGNALS

[75] Inventor: Jens K. J. Rosebrock, Bremen, Fed. Rep. of Germany

[73] Assignee: U.S. Philips Corporation, New York, N.Y.

[21] Appl. No.: 108,400

[22] Filed: Oct. 13, 1987

[30] Foreign Application Priority Data

Oct. 11, 1986 [DE] Fed. Rep. of Germany ....... 3634691

[51] Int. Cl.$^4$ .............................................. H03M 3/04
[52] U.S. Cl. .................................... 341/143; 341/200; 358/13; 375/27
[58] Field of Search ....... 340/347 AD, 347 C, 347 M, 340/347 DA, 347 R; 375/27-34; 332/11 D; 341/126, 142, 143, 144, 200; 358/13, 133, 135, 138; 381/29, 31

[56] References Cited

U.S. PATENT DOCUMENTS

| | | | |
|---|---|---|---|
| 4,179,659 | 12/1979 | Tashiro | 375/27 |
| 4,542,516 | 9/1985 | Weirich | 375/30 |
| 4,592,070 | 5/1986 | Chow et al. | 375/30 X |
| 4,743,967 | 5/1988 | Takenaka et al. | 375/27 X |

Primary Examiner—William M. Shoop, Jr.
Assistant Examiner—Brian K. Young
Attorney, Agent, or Firm—Edward W. Goodman

[57] ABSTRACT

In known differential encoder and decoder systems, a number of processing steps within a scanning clock must be performed in the differential pulse code modulator at one location in a time-critical loop, namely a summation, a multiplication with addition, a subtraction and a quantization. For the case, which practically always occurs, particularly in picture processing, where a number of signals not used for the prediction sample is located between the signals used for the prediction sample, a solution is provided in which only a translation and an addition are required within the time-critical loop. Such an arrangement corresponds to a special split-up of the equation for the prediction error signal in single terms. The solution provided can be modified in different manners so as to economize on elaborate components, and can also be used for adaptive modulators. The same measures can also be used in the demodulator.

12 Claims, 8 Drawing Sheets

SYSTEM FOR TRANSMITTING OR STORING INPUT SIGNALS

BACKGROUND OF THE INVENTION

The invention relates to a differential encoder and decoder system for transmitting or storing input signals, comprising a differential pulse code modulator at the input end and receiving the input signals applied to a system input in the form of a sequence of signal samples successively occurring at a first clock rate and supplying a quantized error signal sample from the modulator output at a second clock rate, and comprising a differential pulse code demodulator at the output end, receiving at a demodulator input the quantized error signal samples in the form of a sequence occurring at said second clock rate and generating a reconstructed signal sample for each error signal sample and applying it to a system output.

Such systems are generally known and are used to represent the input signals with a minimum possible amount number of bits without distorting the reconstructed signals to a too large extent. A differential pulse code modulator for such a system is known, for example from the magazine "IEEE Transactions on Communications", Volume Com-30, No. 5, May 1982, pages 1174-1184 and has the principle structure shown in FIG. 1. The input signal samples $s(n)$ are successively applied to the input 1 at a clock rate $1/t$, in which n is an arbitrary point of time within the sequence. In the differential stage 2, an internally generated prediction signal sample $s''(n)$ is subtracted from each input signal sample $s(n)$, which sample is applied via the lead 9, and the error signal sample $e(n)$ is produced at the output 3 of the differential stage 2. This error signal sample $e(n)$ is applied to a quantizer 4 for quantizing and coding e and which supplies these quantized and coded samples to the output 5. The quantized error signal sample $e'(n)$ is applied to the first input of a first adder 6 whose second input receives the prediction signal sample $s''(n)$ via the lead 9 and which supplies the reconstructed signal sample $s'(n)$ from its output lead 7 and applies it to a predictor 8. This predictor 8 successively generates the sum of a number of preceding differently weighted reconstructed signal samples $s'(n-m)$ with the aid of multipliers and delay devices and each sum thus formed represents a prediction signal sample $s''(n)$ which is supplied from the lead 9. Dependent on the extent of correlation among the input signal samples $s(n)$, the range of values of the error signal sample e is considerably reduced and due to the quantization and coding, a further reduction of the information quantity is achieved so that in the case of a binary representation of all signals, the quantized error signal samples $e'$ on the output lead 5 comprise considerably fewer bits than the input signal samples s at the input 1. Since the adder 6 uses the quantized error signal sample $e'$ to form the reconstructed signal $s'$, the quantization errors are constantly taken into account so that no quantization errors can be accumulated in the quantized error signal $e'$.

As is shown in FIG. 1, the subtraction in the differential stage 2, the formation of the quantized error signal samples $e'$ in the quantizer 4, the addition in the adder 6 and, particularly, the formation of the weighted sum in the predictor 8 must be performed in a time-critical loop within one sampling period in order that the associated prediction signal sample $s''(n+1)$ is available after applying an input signal sample $s(n)$ at the instant at which the next input signal sample $s(n+1)$ arrives. These elements thus constitute the time-critical loop. At high sampling frequencies of the input signal samples, as for example in television picture signals, only a very short time is available for this sequence of processing steps within the time-critical loop so that high-speed components, which are costly and require much energy, must be used to perform the individual signal processing steps.

FIG. 3 of the above-mentioned document illustrates a conversion of the differential pulse code modulator using two predictors. However, this conversion only serves to inspect the stability of such an arrangement and does not otherwise produce the number of processing steps required within a sampling time interval.

DE-OS 34 17 139 describes a differential pulse code modulator for high processing speeds, using one adder less in the time-critical loop as compared with the state of the art. However, this adder should only be economized during summation of the prediction signal in the parallel predictors so that the time-critical loop still comprises the four elements of differential stage, quantizer, adder and predictor. EP Patent Application 176 821 describes a differential pulse code modulator in which the number of processing steps in the time-critical loop should also be reduced. For this purpose the differential stage is divided into two individual differential stages which are separated by a register. The differential stage connected immediately before the quantizer receives at its subtracting input the error signal samples multiplied by a coefficient instead of the reconstructed signal so that the time-critical loop comprises one adder less. This is, however, apparently based on the supposition that each prediction signal sample is only formed from the last preceding error signal sample by multiplying it by a coefficient which can be represented as an integral negative power of two. The extension of this arrangement to other cases, particularly to the formation of each prediction sample from a plurality of preceding error signal samples and reconstructed signal samples, cannot be concluded from this Application.

SUMMARY OF THE INVENTION

It is an object of the invention to provide a system of the type described in the opening paragraph in which both in the modulator and in the demodulator a reduced number of processing steps is required within a sample time interval of the input signal samples, which processing steps can be performed with simple components and in which a simple application as to a demodulator is also possible.

According to the invention, this object is solved in that the modulator comprises a differential stage which receives input signal samples at a first input at a first sample rate, a quantizer with which at said first rate each clock signal receives internally generated error signal samples and supplies quantized error signal samples a pre-predictor, a sub-predictor and a post-predictor which are coupled to the differential stage and to the quantizer, the pre-predictor generating at said first rate first sub-signal samples by the multiplication of a first number of input signal samples by an associated first number of coefficients, and the sub-predictor generating second sub-signal samples by multiplication of a second number of reconstructed signal samples by an associated second number of coefficients, and in that the post-predictor, which comprises a series-arrangement of a number, corresponding to the first number, of alternately a further adder and a delay stage with a delay time of one sampling period, the first of the further adders receives at an input the difference between an input signal sample and the sum of the two sub-signal samples at least the second sub-signal sample of which is shifted by a first delay circuit, and all further adders of the series arrangement receive at their inputs not connected to a delay stage the output signal from a translator which is directly controlled by the error signal sample, and the last delay stage of the series arrangement supplies the error signal sample, and in that the modulator comprises a first adder which receives at sampling rate at a first input the quantization error signal samples formed from the error signal sample in a further stage and the input signal sample temporally corresponding to the error signal sample at a second input via a second delay circuit having a delay time corresponding to the first number of sampling periods, and each time supplies a reconstructed signal sample, and in that the demodulator comprises at least one sub-predictor with an associated first delay circuit and one post-predictor constructed in conformity with the modulator, and the post-predictor of which receives at least the sum of an output signal sample of the sub-predictor and a signal sample derived from the quantized error signal sample at the demodulator input, and the sub-predictor receives a signal sample derived from the output of the post-predictor, while the reconstructed signal samples can be derived from the output signal samples of the post-predictor.

According to the invention, only a translator and an adder of the post-predictor are provided in the time-critical loop of the modulator and the demodulator for each coefficient of the first number so that within a sampling period, only a transit time through the translator and the addition of the signal sample supplied thereby are required. All other signal processing steps may be performed in stages in which, particularly for the multiplication by the coefficients, an arbitrary amount of time is available. This particularly applies to the pre-predictor but also to the sub-predictor if the time interval is large, as is often the case, for example when storing or transmitting picture data. If there is no time interval, the sub-predictor may also be dispensed with. Due to the sub-division of the predictor according to the invention and the arrangement of the components, the differential stage no longer directly receives the complete prediction signal samples but only sub-signal samples. The translator may be constituted by a parallel multiplier or, since the coefficients are fixed, it may even be more simply constituted by one or more parallel read-only memories. Since the quantized error signal is no longer used for the predictor, the quantizer may generate this signal directly in a coded form.

The sum of the two sub-signal samples and the difference with the input signal may be fundamentally formed in a correspondingly constructed single stage. According to an embodiment of the invention, a simpler solution is characterized in that for forming the sum of the two sub-signal samples and the difference with the input signal sample, at least the modulator comprises an adder and a differential stage, each respectively followed by delay stages of one sampling period each, which delay stages supply each intermediate result and final result, respectively, and in that the delay of the signal samples is taken into account by these delay stages in the delay period of the first and second delay circuits. This further embodiment allows for the fact that before the sub-predictor and the post-predictor and in the case of sufficiently large time intervals, an increase of the signal processing time is also possible in the sub-predictor without any difficulties, which only becomes manifest by an increased transit time of the signal through the entire arrangement, which is, however, almost always insignificant so that simple standard stages can be used for the addition or subtraction of each time two signals, for each of which a full sampling period is available.

The multiplications in the pre-predictor and in the sub-predictor may also be performed by translators, for example in the form of read-only memories which are, however, costly particularly in the case of large signal sample ranges. A less costly solution is therefore characterized in that at least the pre-predictor comprises a further series arrangement of alternately a further adder and a delay stage, the further adders of which receive the signal samples applied to the pre-predictor at those inputs which are not used for the series arrangement, more specifically via multipliers which multiply a coefficient by a signal sample by means of successive, clock signal interval shifted additions, while the overall delay is equal in each multiplier, and in that the differential stage receives the input signal samples via a third delay circuit whose delay time corresponds to the overall delay of each multiplier. By using the third delay circuit, the signal delay time in the pre-predictor may be relatively large so that the multiplications by the coefficients in the form of successive additions can be performed by means of relatively slow components.

According to a further embodiment of the invention, the sub-predictor is also constructed in conformity with the pre-predictor and the delay time of the first delay circuit arranged in series with the sub-predictor is selected to be shorter by an amount which equals the overall delay of the multipliers in the sub-predictor. The signal transit time through the sub-predictor is thus taken into account in the first delay circuit so that also the sub-predictor may be constructed with relatively slow components. As will hereinafter be described in greater detail, the signal transit time through the sub-predictor must only be shorter than the time interval between the signal samples from which each of the two sub-signal samples are formed: this, however, will be so in substantially all applications.

Particularly in the case in which this time interval is relatively large, delay stages may also be dispensed of in the delay circuits in a further embodiment of the invention in that an input of the first of the further adders in the pre-predictor receives the second sub-signal samples from the output of the sub-predictor and in that the delay time of the first delay circuit is selected to be further shortened by an amount which equals the number of delay stages in the further series arrangement in the pre-predictor. This embodiment utilizes the fact that the order of adding a plurality of signals does not matter.

The quantization error signal samples required for the first input of the first adder may be generated in different manners, for example, also by controlling a translator by means of the error signal samples, or by means of a differential stage which may also be followed by an additional delay stage so as to reduce the required signal processing speeds, while the delay time of this additional delay stage may be taken into account in other stages. A further very simple embodiment according to the invention, in which the formation of these quantization error signal samples necessitates hardly any elaborate components, is characterized in that in each sampling period, the first input of the first adder receives the quantization error signal sample multiplied by a coefficient from the translator of the post-predictor and the second input of the first adder receives the input signal sample multiplied by the same coefficient from the corresponding multiplier of the pre-predictor, and in that the sub-predictor performs multiplications by the second number of coefficients which are divided by the coefficients comprised in the signal samples of the first adder. Since the multiplication of both the input signal and the error signal must be performed by the same coefficient, signals which are already present anyway may be used in this way for the first adder.

When generating a prediction signal sample, a given coefficient series is used which results from a given mutual correlation of the input signals. The optimum coefficient series, thus the series generating the smallest error signals is, however, also dependent on the actual sequence of the individual input signal samples and for a reduction of the number of error signals, it is known to use a plurality of predictors generating a plurality of prediction signals by means of different coefficient series, to differently weight these prediction signals dependent on the input signal samples to be processed, and to sum the weighted prediction signals to an overall prediction signal which is applied to the differential stage and to the first adder. This principle is also usable in the present invention and, according to a further embodiment of the invention, a differential pulse code modulator using adaptive prediction is characterized in that a plurality of individual differential pulse code modulators is provided, of which the output signal of the first series arrangement is applied via multipliers for multiplying by individual weighting factors, whose sum equals 1, to a summing device whose output signal represents the adaptive prediction error signal which is applied to the common quantizer and to the translators in each individual differential pulse code modulator. Since the quantizer in the differential pulse code modulator according to the invention is located outside the loop, the weighted summation is used for the error signals generated by the individual differential pulse code modulators and the overall error signal is then fed back. The weighting factors for the multipliers may be generated in known manner. The weighting factors may be generated in such a manner that they only assume the value zero or one, i.e. the error signal of only one of the individual differential pulse code modulators is selected and the error signal of the other modulators is ignored and in this case it is essential that the multipliers and the summing device are replaced by an adaptively controlled multiplexer. This results in a simple and fast construction because the multiplieres and the summation device would be located in the time-critical loop.

A further possibility of taking the properties of the sequence of input signals into account is to adjust the quantization characteristic adaptively. To this end, a further embodiment of the invention is characterized in that the translator is switchable to adapt the quantization characteristic of the quantizer and the formation of the products. The translators must be switched because the conversion of the error signal samples into the quantization error signal samples is also implicitly performed therein, which conversion must also change upon switching to adapt the quantization characteristic. This measure may also be used together with the afore-mentioned adaptive prediction.

The invention also relates to the modulator itself for the above-mentioned system as well as to the demodulator. The quantized error signal is conventionally demodulated by using a predictor which is similar to the predictor used for modulation because the reconstructed signal is produced in the modulator at the input of the predictor, i.e. at the output of the first adder. For this reason, the demodulators may be formed from one modulator in which only given connections are interrupted, namely the connection between the input of the demodulator and either the pre-predictor and an input of the adder or the subtracting input of the differential stage. Thus a uniform circuit can be manufactured which, with small changes such as the said connections and the contents of the translators, can be used as a modulator or as a demodulator, which is particularly advantageous when realizing them in the form of an integrated circuit.

BRIEF DESCRIPTION OF THE DRAWINGS

The invention will now be described in greater detail by way of example with reference to the accompanying drawings, in which.

DETAILED DESCRIPTION OF THE INVENTION

The system according to the invention essentially consists of a differential pulse code modulator and a differential pulse code demodulator between which a transmission path or a memory is arranged in known manner whose structure is not important to the invention and is therefore not further described. Furthermore, the modulator and the demodulator have similar constructions so that only the modulator of the system according to the invention will first be described in greater detail.

Figure 1:
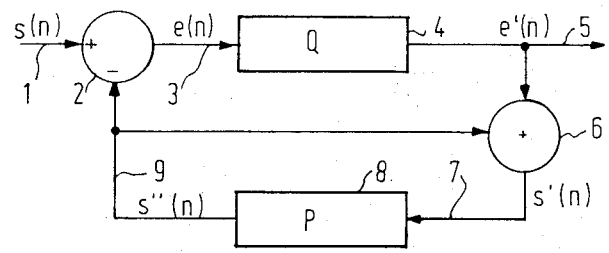
FIG. 1 shows the structure of a known differential pulse code modulator.

FIG. 1 shows the circuit diagram of the known differential pulse code modulator which has been described in the opening paragraph. As is shown in the Figure, the following ratios hold for individual signal samples:

$$e(n)=s(n)-s''(n); \; s''(n)=s(n)-e(n) \quad (1)$$

$$s'(n)=s''(n)+e'(n) \quad (2)$$

Combination of these two equations results in $$s'(n)=s(n)-e(n)+e'(n) \quad (3)$$

By quantization of the error signal sample e(n) in the quantizer 4, the quantization error signal sample is obtained.

$$q(n)=e'(n)-e(n) \quad (4)$$

Since the quantized error signal sample e'(n) is a uniform function of the error signal sample e(n), the quantization error signal sample q(n) is also a uniform function of the error signal sample e(n).

Combination of the two equations (3) and (4) results in $$s'(n)=s(n)+q(n) \quad (5)$$

and $$e'(n)=e(n)+q(n) \quad (6)$$

follows from equation (4).

These equations show that the same quantization error q occurs in the reconstructed signal s' as in the quantized error signal e'.

In a linear predictor, the prediction signal sample s''(n) is formed in accordance with the following equation:

$$s''(n) = \sum_{m=1}^{M} a_m s'(n-m) \quad (7)$$

For the error signal sample to be found, the result according to equation (1) is:

$$e(n) = s(n) - \sum_{m=1}^{M} a_m s'(n-m) \quad (8)$$

Each prediction signal sample s''(n) is thus formed from a predetermined number of preceding reconstructed signal samples s'(n−m), with each signal sample being multiplied by a corresponding coefficient $a_m$ and all products being summed. The starting point is that the input signal samples s(n) arrive linearly with respect to time, i.e. at sampling frequency. If the input signal samples s(n) are initially present in a two-dimensional or multi-dimensional form, they can substantially always be converted into a one-dimensional sequence.

For such sequences, for example in the case of differential pulse code modulation of the pixels of a two-dimensional picture for storage or transmission, the coefficients for at least a number of successive preceding reconstructed signal samples have the value zero because the correlation of the associated input signal samples with the instantaneously considered input signal samples is too small. The following considerations also apply if a plurality of such time intervals are located between the signal samples which are actually taken into account for the formation of the prediction signal samples, while essentially only the first of these intervals is taken into account and the subsequent input signal samples and coefficients are considered as a coherent sequence. In particular, the following coefficients are assumed to be zero:

$$a_i=0 \text{ for } L+1 \leq i \leq K-1 \quad (9)$$

Thus a time interval is located between the samples L and K, i.e. the input signal samples and reconstructed signal samples present in these intervals are not taken into account for forming the prediction signal sample s''(n) and the signal samples and coefficients considered are thus split up into two groups.

In equation (8) the summation for these two groups is now written separately:

$$e(n) = s(n) - \sum_{m=1}^{L} a_m s'(n-m) - \sum_{m=K}^{M} a_m s'(n-m) \quad (10)$$

The second sub-sum is formed from reconstructed signal samples which are situated earlier and for which sufficient time is available because the duration of the time interval is T=K−L−1. Only the first sub-sum is time-critical because, in accordance with FIG. 1, the reconstructed signal sample cannot be found until the associated prediction signal sample has been generated by the predictor.

This first sub-sum is then split-up in accordance with equation (5) so that the following expression results for the error signal sample:

$$e(n) = s(n) - \sum_{m=1}^{L} a_m s(n-m) - \sum_{m=1}^{L} a_m q(n-m) - \sum_{m=K}^{M} a_m s'(n-m) \quad (11)$$

In a more simplified form, with sign reversal, which is essential for the realization to be described hereinafter:

$$-e(n) = s''_V(n) + s''_N(n) + s''_T(n) - s(n) \quad (12)$$

with $$s''_V(n) = \sum_{m=1}^{L} a_m s(n-m) \quad (13)$$

$$s''_N(n) = \sum_{m=1}^{L} a_m q(n-m) \quad (14)$$

$$s''_T(n) = \sum_{m=K}^{M} a_m s'(n-m) \quad (15)$$

Each prediction signal sample is thus split up into three sub-sums or sub-signal samples, while the first sub-signal sample s''$_V$(n) is directly determined from earlier input signal samples so that a substantially arbitrary amount of time is available for this purpose. A long calculation time for this purpose becomes only manifest in a long constant signal transit time. The third sub-sum, which is designated as the second sub-signal sample $s''_T(n)$, corresponds to the second sub-sum of equation (10) for which also a longer processing time is available if a sufficiently large time interval is taken. The middle sub-sum $s''_N(n)$ is a function of the quantization error signal samples of a number of immediately preceding error signal samples, while the quantization error signal is a uniform function of the prediction error signal, as explained above. Therefore, each product $a_m q(n-m)$ can be directly determined from the relevant error signal sample. Equation (12) is to conform to the arrangement shown in FIG. 2 in which, initially delays due to signal processing periods are ignored. The input signal samples $s(n)$ at the input 1 are applied to the differential stage 2 and, in accordance with equation (12), to the subtracting input and furthermore to a unit 12 designated as a pre-predictor for the purpose of generating a first sub-signal sample $s''_V(n)$ with each clock signal, as well as to an input of the first adder 6. The other input of the first adder 6 receives the quantization error signal sample $q(n)$ which is formed in a unit 22 from the error signal sample $e(n)$, as is indicated by the dot-and-dash line. The unit 22 may also be a translator consisting of a memory addressed by the error signal sample $e(n)$ or of a wired-in logic circuit. Another possibility is to form the quantization error signal sample $q(n)$ by forming the difference between the error signal sample $e(n)$ and the quantized error signal sample $e'(n)$ in a subtraction stage 20. The subtractor 20 may also be followed by a delay stage for a clock signal period in order to avoid directly successive adder stages, as will be described in greater detail hereinafter, because such a delay in the further signal path connected to the output of the adder 6 and at the other input of the adder can be taken into account if the time interval T is larger than the time required for the formation of the second prediction sub-signal. A solution in which neither a subtractor 20 nor a separate unit 22 is required will be described hereinafter.

The output of the first adder 6, supplying a reconstructed signal, sample $s'(n)$ with each clock signal is connected to the series arrangement of a delay circuit 18 and a circuit 14 designated as a sub-predictor supplying the second sub-signal sample $s''_T(n)$. The last term of the sum $s''_N(n)$ of the prediction signal sample $s''(n)$ is formed by a unit 16 designated as a post-predictor which is directly controlled by the error signal sample $e(n)$ via the lead 3. All three terms of the sum, $s''_V(n)$, $s''_T(n)$ and $s''_N(n)$, are summed in a summing device 10 and yield the complete prediction signal sample $s''(n)$ which is applied via the lead 9 to the differential stage 2 namely to the adding input, as is expressed in equation (12), so that the negative error signal sample $-e(n)$ is generated. This sign can be taken into account in the quantizer 4 as well as by corresponding signs of the coefficients in the post-predictor 16. The units 10-18 thus constitute the predictor 8'.

Figure 3A:
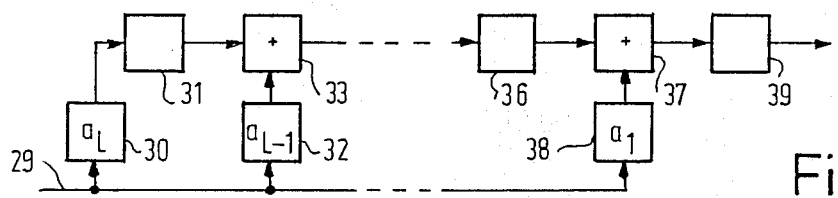
FIGS. 3a and 3b show further details on the structure of a predictor and the pre- and sub-predictors of the arrangement of FIG. 2 as well as the structure of the multipliers used therein.

The units 12, 14 and 16 may be constructed in a manner as is shown in FIG. 3a. The signal applied via the input 29 is parallel applied to a number of multipliers 30, 32 etc. to 38 in which this signal is multiplied by the corresponding coefficients $a_L$, $a_{L-1}$ etc. to $a_1$. The outputs of the multipliers 32 to 38 are connected to inputs of adders 33 to 37, respectively, each followed by delay stages 36 to 39. With each clock signal, each of these delay stages takes over the signal sample present at its input and makes it available at the output until the next sample instant so that each delay stage effects a delay of the signal by one clock signal period. The series arrangement comprising a multiplier, an adder and a delay stage may be larger than the one represented, as is indicated by the broken lines, dependent on the number of coefficients $a_m$. The first adder in the circuit, which should be located between the output of the multiplier 30 and the delay stage 31 in the case of a systematical structure, has been omitted because it constantly receives the zero signal at its other input and is thus superfluous. In other arrangements to be described hereinafter, in which the series of adders and delay stages receives a further signal for the purpose of addition, such an adder is of course required. As negative signal samples may occur due to subtraction, the adders should be adapted to process such signal samples.

In order to describe the functions of the arrangement of FIG. 3a, it is assumed that a signal sample $x(n)$ is applied to the input 29. The product of the preceding signal sample $x(n-1)$ with the coefficient $a_L$, i.e. the signal sample $a_L x(n-1)$, is then present at the output of the delay stage 31. To this end, the product of the signal sample $x(n)$ and the coefficient $a_{L-1}$ is added in the adder 33 so that the signal sample $a_{L-1}x(n)+a_L x(n-1)$ is present at the output of the adder 33. This is continued stage by stage in the series with a continuing delay so that finally the signal sample $a_1 x(n) + \ldots + a_{L-1}x(n-L+2)+a_L x(n-L+1)$ is present at the output of the adder 37. Thus the earliest supplied signal sample multiplied by the coefficient $a_L$ appears at the output of the delay stage 39 with a delay which is equal to the number of sampling intervals. The signal sample multiplied by the coefficient $a_1$ is, however, only delayed by one sampling period.

Figure 2:
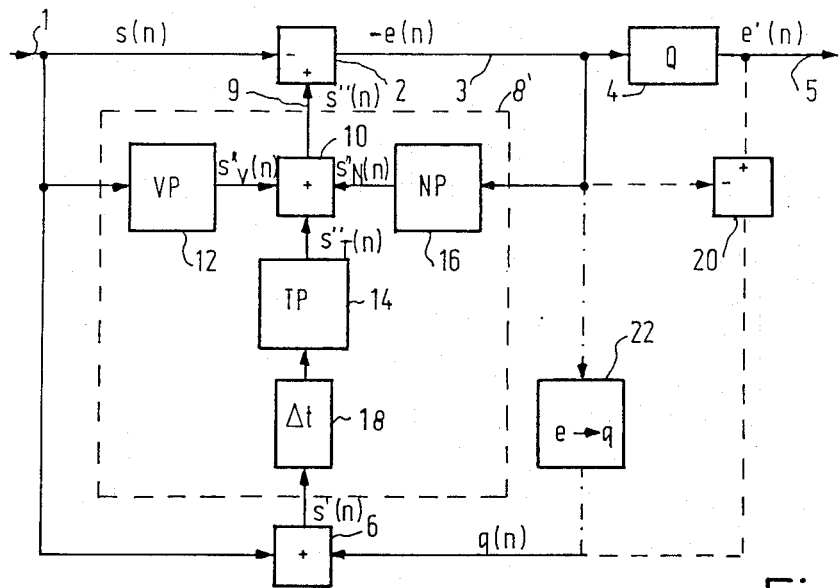
FIG. 2 shows the circuit diagram of a differential pulse code modulator with a division of the prediction samples in a system according to the invention.
Figure 3B:
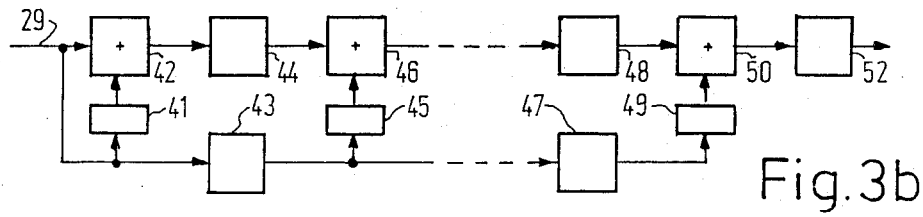

The delay time in the individual multipliers 30, 32 and 38 has been ignored in this case. Such a delay which is equal in all multipliers becomes manifest only in an additional extension of the signal transit time through the arrangement. Since a longer processing period is available for the pre-predictor 12 and the sub-predictor 24 in FIG. 2, the multipliers 30, 32 to 38 may be constructed in the manner as shown in FIG. 3b. The multiplication is performed by a multiplier-determined number of shifted additions of the multiplicand. The multiplicand is applied via the input 29 to one input of an adder 42, the other input of which receives the multiplicand in a manner shifted by a number of digits which correspond to the distance between, for example, the two least significant digits having the value one of the multiplier, which digit shift is indicated by the block 41. Subsequently, the multiplicand is temporarily stored in a delay stage 43 and the first sub-sum is temporarily stored in a delay stage 44 whose outputs are directly connected or connected in block 45 in a digit-shifted manner to an adder 46. The delay stages 43 and 44, each having one clock period, only have to perform an addition of two digits within this clock period so that relatively slow elements can be used for the adders. This temporary storage and digit-shifted addition is continued until all digits of the multiplier different from zero have been taken into account. Consequently, at the output of the delay member 52 there appears the product of a signal applied via the input 29 as a multiplicand with a multiplier represented by the digit shifts in the blocks 41, 45 to 49 with a delay of a number of clock periods which is one less than the number of ones in the multiplier. To decrease the number of stages, it may also be essential to replace individual adders by subtractors. In any case, the adders should also be adapted to process negative signal samples in this case. In order to achieve a predetermined delay time which is determined by the multipliers having the largest number of stages, the delay stage 52 may be succeeded by further delay stages. If the least significant digit in the multiplier is not a 1, the signal may already be applied to the input 29 in a digit-shifted manner, or the digit shift is performed at the output. The multiplication by digit-shifted addition in accordance with FIG. 3b may, hwoever, be used only in the pre-predictor 12 and in the sub-predictor 14 of the arrangement according to FIG. 2 because only one clock period is available for the next prediction signal sample in the post-predictor 16 for processing the last occurring error signal sample. In addition, FIG. 2 has two arithmetical processing operations in the summing device and the differential stage 2 immediately succeeding each other, which, for reasons of speed, is not favorable either.

Figure 4:
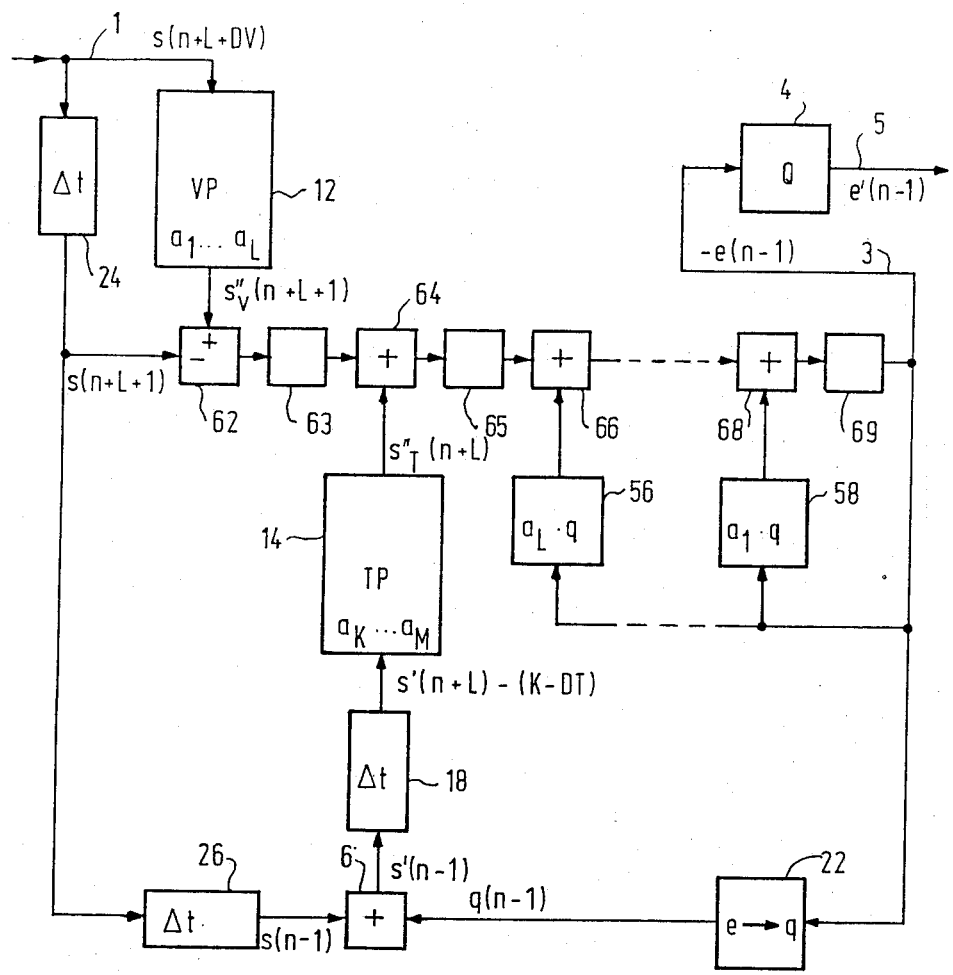
FIG. 4 shows the detailed structure of a differential pulse code modulator in a system according to the invention, particularly as regards the post-predictor.

An arrangement in which in each clock period only one arithmetical processing operation of two signal samples and additionally at most a memory access must be performed is shown in FIG. 4. The two stages 2 and 10 in FIG. 2 are split up into a series of a differential stage 62, an adder 64 and the first adder 66 in the post-predictor, succeeded by delay stages 63 and 65, respectively. The post-predictor is constructed from a series of adders and delay stages in the manner described with reference to FIG. 3a, while, compared with this Figure, the first adder of the series is not omitted but the series begins, in FIG. 4, with the adder 66 in which the subsequently arranged delay stage is not shown for the sake of clarity, and ends with the adder 68 and the subsequently arranged delay stage 69 forming the end of the series. The lower inputs of the adders 66 to 68 receive the output signals of a translator which in this case comprises, for example, single read-only memories 56 to 58 which are directly addressed by the prediction error signal e (more precisely: —e as explained with reference to FIG. 2) on the lead 3 and at each address comprises the value of the product of the quantization error signal q associated with this prediction error signal e and each coefficient $a_1$ to $a_L$. In addition, the prediction error signal e on the lead 3 is applied to the quantizer 4 which may also be a translator, for example, in the form of a read-only memory which at each address location comprises the associated quantized error signal e' and, as already stated hereinbefore, the coded quantization stage number, as well as a further translator 22 which generates the quantization error signal sample q for each error signal sample e(n).

As is evident from FIG. 4, only an access to the translators, formed in this embodiment as memories 56 to 58, and the addition of the signal values read from these memories in the adders 66 to 68 to the signal value simultaneously applied to the left-hand inputs is required within a clock signal period in order that this sum can be taken over with the next clock signal in each subsequently arranged delay stage, while simultaneously the next access to the memories 56 to 58 is effected, etc.

The difference between the associated input signal s and the sum of the two prediction sub-signals $s''_V$ and $s''_T$ must now be added by the pre-predictor and the sub-predictor to the signal generated in the series comprising the elements 66 to 69, which can be effected at the end of the series of the elements 66 to 69 of the post-pre-dictor. However, in that case one stage for processing more than two signals simultaneously or one series of a plurality of processing stages without a delay member in between would be required, because only a single delay stage may follow the adder 68 in order that the lower input of this adder 68 each time receives the signal sample derived from the error signal sample which has just preceded it. However, since the sequence of additions and subtractions is arbitrary when processing signals and if there are no other operations, the intermediate signal formed from the input signal s and the two prediction sub-signals $s''_V$ and $s''_T$ is applied to the left-hand input of the adder 66 so that a delay of each intermediate signal sample is effected as far as the output of the delay member 69. This delay is taken into account in that a delay circuit 26 is arranged before the left-hand input of the adder 6, which circuit delays the applied input signal samples s(n). Also the delay which is effected, for example for the input signal samples upon passing through the delay stages 63 and 65 as far as the input of the adder 66 must be taken into account, likewise as the delay stage 65 must be taken into account in the case of the overall delay of the signal samples in the sub-predictor 14 and the delay circuit 18 which is pre-arranged in this embodiment, while the delay produced by the multipliers in the pre-predictor 12 is taken into account by the delay circuit 24.

In order to consider the individual delays more precisely, the signal samples associated with given points of time are indicated on separate leads in FIG. 4 in which the error signal sample $e(n-1)$ on the lead is used as a reference point of time. The reference $(n-1)$ denotes an arbitrary point of time. Since in the post-predictor the series comprising the element 66 to 69 has exactly L delay stages with a delay of one clock period each, namely for each coefficient $a_m$ a delay stage, as is clearly evident from FIG. 4, the signal sample on the lead 3 is present at this point of time at the left-hand input of the adder 66 is associated with the point of time $(n+L-1)$. Consequently, the second sub-signal value $s''_T(n+L)$ must be present at the output of the sub-predictor 14 in order to take the delay in the delay stage 65 into account. Correspondingly, the signal samples $s''_V(n+L+1)$ and $s(n+L+1)$ are required at the inputs of the differential stage 62. Since the last-mentioned signal value is also simultaneously present at the input of the delay circuit 26, it must have a delay of $D_{26}=L+2$ sampling periods in order that the signal sample $s(n-1)$ is applied to the left-hand input of the adder 6, at the instant that the signal sample $q(n-1)$ is present at the right-hand input.

Each signal sample $s''_T(n+L)$ at the output of the sub-predictor 14 is formed from signal samples, the last sample of which is associated with a point of time located in accordance with equation (15) K clock periods before the point of time of the signal sample at the output, thus associated with the point of time $(n+L-K)$. As a total of $L+1$ delay stages are located between the output of the sub-predictor 14 and the input of the delay circuit 18, the overall delay of sub-predictor 14 and delay circuit 18 must total $K-L-1$ clock periods. If in the sub-predictor 14 a delay of $D_{14}=DT$ clock periods is generated by means of a multiplication performed in accordance with FIG. 3b, i.e. if the last signal sample used for the output signal $s''_T(n+L)$ is $s'((n+L)-(K-DT))$, the delay circuit 18 must have a delay time of $D_{18}=K-L-DT-1=T-DT$ clock periods. The fact that the delay period of this delay circuit 18 may be minimally zero results in the time interval between the two groups of signals used for determining the error signal e on the lead 3 having to be at least as large as the overall delay DT in the sub-predictor 14.

If the delay period in the pre-predictor 12 between its output signal sample $s''_V(n+L+1)$ and the temporally last input signal sample used for this purpose is assumed to be DV based on the multiplication performed in accordance with FIG. 3b, the delay period $D_{24}$ of the delay circuit 24 must be exactly $D_{24}=DV-1$ clock periods in order that a given input signal sample $s(n+L+1)$ is present at the subtracting input of the differential stage 62 and that the first sub-signal sample $s''_V(n+L+1)$ formed from the immediately preceding input signal samples is present at the other input.

It is thus clearly evident that for various applications, i.e. at various values of L and K, the corresponding delays in the delay circuits 18, 24 and 26 can be taken into account, at least while taking into account the afore-mentioned limitation for the minimum duration of the time interval.

Figure 5:
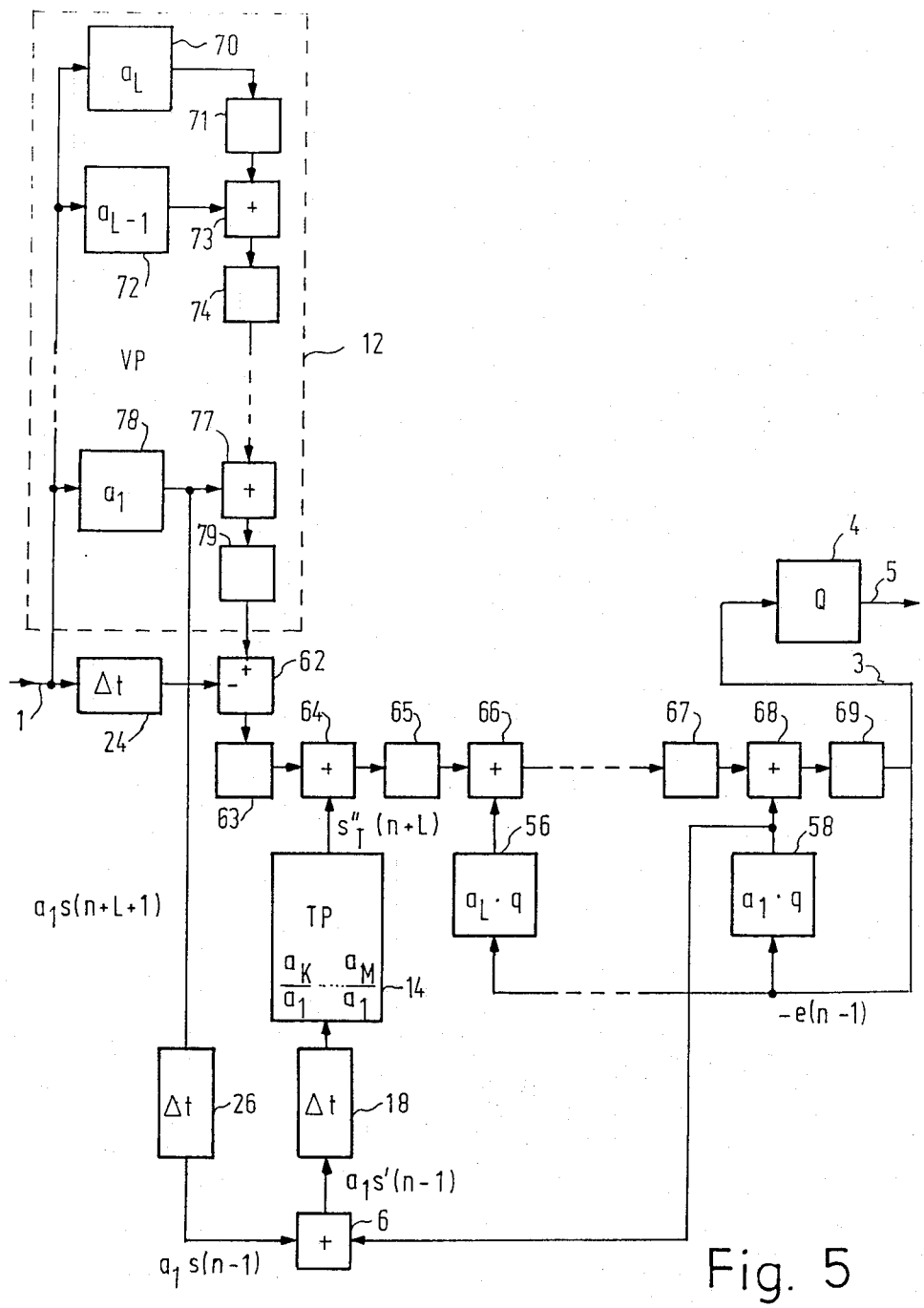
FIG. 5 shows a further embodiment of the arrangement of FIG. 4 requiring fewer components.

FIG. 5 shows an arrangement in which, as compared with the arrangement according to FIG. 4, the converter 22 converting the prediction error signal into the quantization error signal is economized. The fact is utilized that the translators 56 to 58 already perform such a conversion, though additionally connected in a multiplicative manner with the value of the corresponding coefficient $a_m$. As is, however, clear from FIG. 5 in which the pre-predictor 12 in accordance with FIG. 3a is shown in greater detail, the product of the input signal in this pre-predictor is also generated with each of these coefficients $a_1$ to $a_L$. If the inputs of the adder 6 are connected to the outputs of one of the translators 56 to 58, for example as is shown for the output of the translator 58, and to the corresponding output of the multiplier 78 in the pre-predictor 12, in this case via the delay circuit 26, the reconstructed signal multiplied by the corresponding coefficient, namely $a_1s'$, is produced at the output of the adder 6. This coefficient $a_1$ in the reconstructed signal $s'$ poses no problems because it can be taken into account in the coefficients $a_K$ to $a_M$ of the sub-predictor 14, i.e. the sub-predictor 14 performs multiplications by the factors $a/K-a/1$ to $a_M/a_1$. Thus, the correct second prediction signal $s''_T$ is again produced at the output of the sub-predictor 14. The required delays of the delay circuits 18, 24 and 26 are not changed, but it can be seen more clearly that the delay period of the delay circuit 24 is equal to the delay period of each of the multipliers 70–78 in the pre-predictor 12 because its overall delay period is extended by an amount equal to the delay of the delay stage 79.

Figure 6:
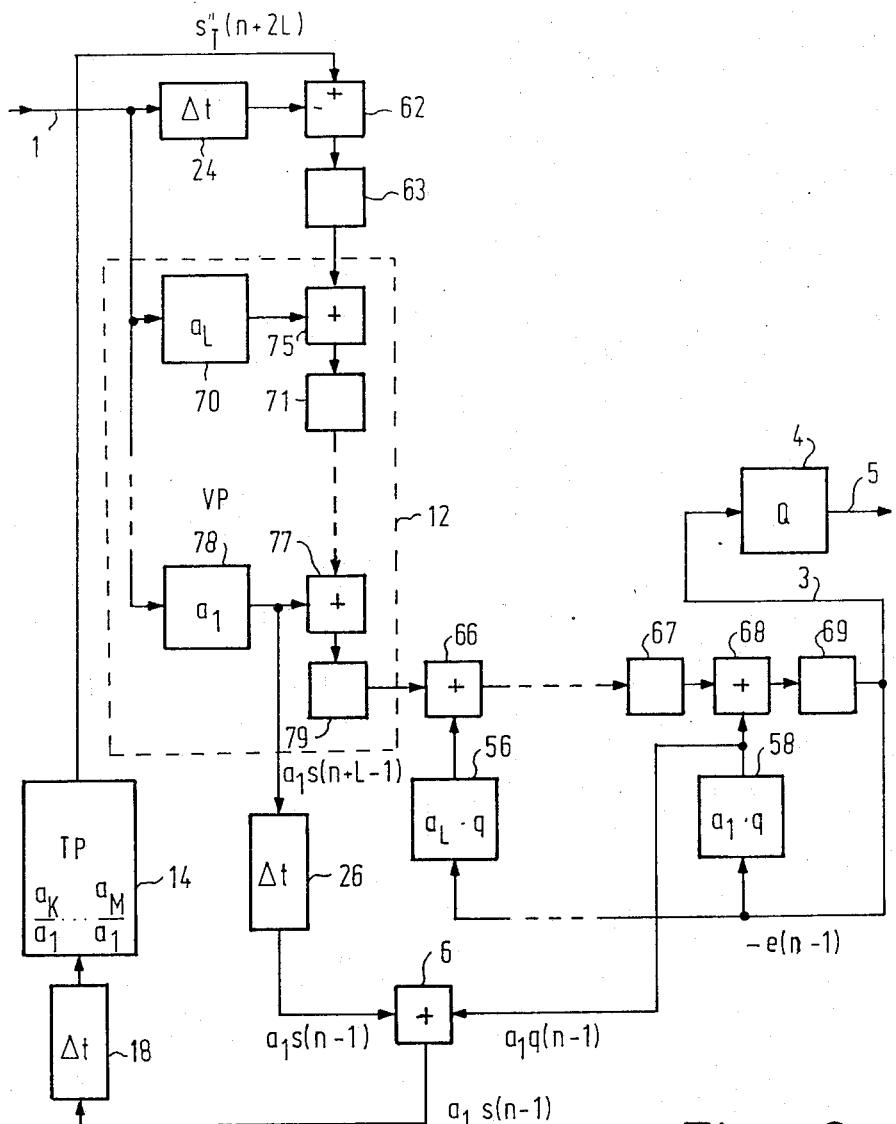
FIG. 6 shows another embodiment according to FIG. 4 in which delay stages are additionally economized.

As described hereinbefore, the time interval T between the signals used for prediction must be at least as large as the delay period of the sub-predictor 14 in the arrangements according to FIGS. 4 and 5. In many applications this time interval is, however, essentially larger, particularly $L+DT$ can be assumed for the interval T, and in addition the aforementioned delay period $DV=L+2$ in the pre-predictor and in this case the arrangement according to FIG. 6 may be used for economizing delay elements in the delay circuit 18. The output signal of the sub-predictor 14, i.e. the second prediction signal $s''_T$, is then applied to the input of the series arrangement of adders and delay stages in the pre-predictor 12, which series arrangement is augmented with the adder 75 at the start, and in this manner, the sum of the delay periods of the delay stages 71 to 79 in the pre-predictor 12 is used for this second prediction sub-signal. It has also been assumed that the delay period of each multiplier 70 to 78 in the pre-predictor 12 is at least 1 larger than the first number L of coefficients so that the differential stage 62 with the subsequent delay stage 63 is now moved in front of the pre-predictor 12, while the subsequent adder 64 with the delay stage 65 are omitted. In this case, the delay period of the delay circuit 24 is also shorter than in the arrangement according to FIG. 5, namely $D_{24}=DM-L-1$ in which DM is equal to the delay period of the multipliers 70 to 78. Since the output of the pre-predictor 12, i.e. the output of the delay stage 79 is now directly connected to the left-hand input of the first adder 66 of the post-predictor, so that the delay stages 63 and 65 of the arrangement according to FIG. 5 are no longer situated in this signal path, the delay period of the delay circuit 26 is correspondingly shorter, namely $D_{26}=L$. Since not only one delay stage, namely the delay stage 63 in this case, but also the L delay stages of the sub-predictor 12 are situated between the left-hand input of the adder 66 and the output of the sub-predictor 14, the delay period of the delay circuit 18 is now $D_{18}=K-2L-DT-1=T-DT-L$.

Figure 7:
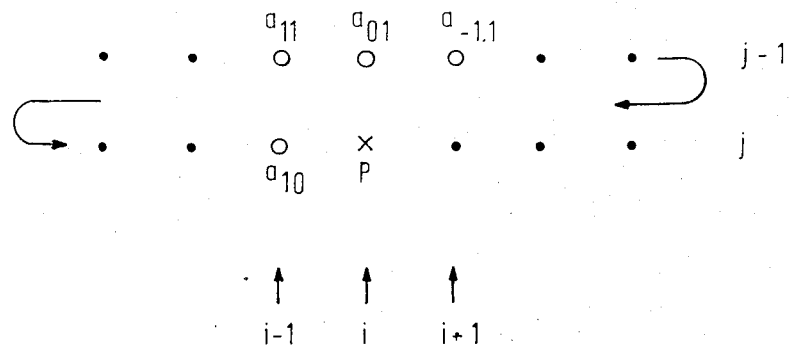
FIG. 7 shows the sequence of signals generated when a picture is line-scanned.
Figure 8:
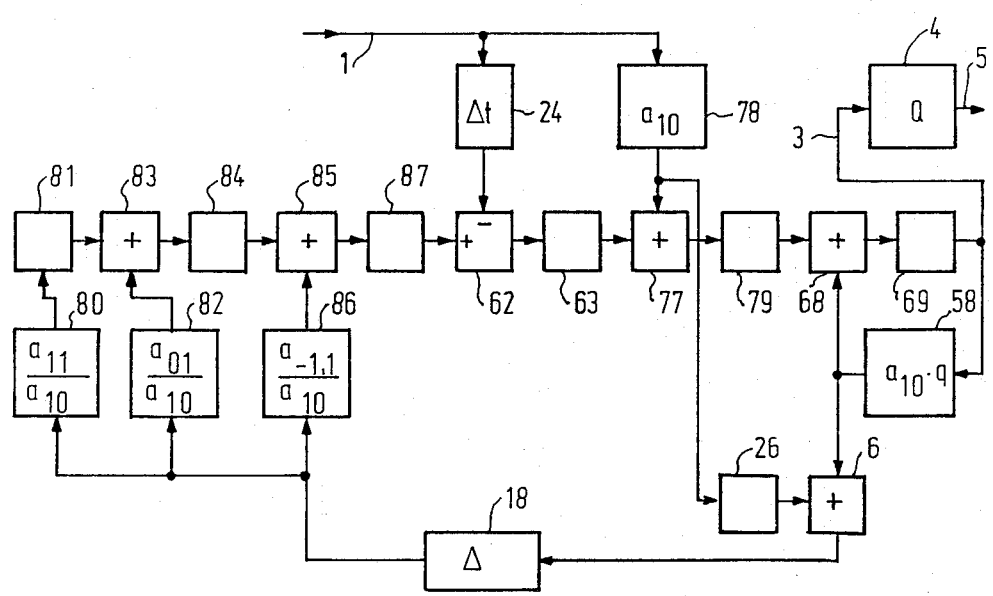
FIG. 8 shows the complete embodiment of a differential pulse code modulator in a system according to the invention for processing such picture signals.

The input signals to be processed may originate from different sources. A frequently used application is the generation of the input signals from the line scanning of a two-dimensional picture. In FIG. 7, two successive lines, namely the lines $j-1$ and $j$, are partly shown which are line-scanned as is indicated by arrows. To determine the prediction sample $s''_{i,j}$ for the point P in the column or row i and the line j, the picture signal values of the four pixels which have already occurred beforehand during picture scanning and which are denoted by the associated prediction coefficients $a_{11}$, $a_{01}$, $a_{-1,1}$ and $a_{10}$ in FIG. 7 are used for the associated picture signal sample in accordance with the equation $$s''_{i,j} = \sum_n \sum_m a_{n,m} s'(i-n, j-m),$$

while the indices are formed from the three rows $i-1$, i and $i+1$ and the two lines $j-1$ and j in which the pixels to be used for prediction are comprised. With reference to the indices used in the previous Figures, the following holds:

$$L=1, K=B-1, M=B+1$$

in which B is equal to the overall number of pixels for each completely scanned picture line. At these values the arrangement according to FIG. 6 can be simplified to the arrangement shown in FIG. 8 in which the sub-predictor 14 of FIG. 6 consists of the multipliers 80, 81 and 86, the adders 83 and 85 and the delay stages 81, 84 and 87. The delay period of the delay circuit 24 is two clock periods shorter than the delay of the multiplier 78 which, together with the adder 77 and the delay member 79, constitutes the pre-predictor. Correspondingly, the post-predictor only comprises the translator 58 and the adder 68 as well as the delay stage 69, and the delay circuit 26 consists only of one single delay stage. The delay period of the delay circuit 18 is five clock periods and the delay period DM of each multiplier 80, 82, 86 is shorter than the number of pixels of a completely scanned picture line, thus $D_{18}=B-5-DM$. In addition to the quantizer 4 a further translator 58 is required and four multipliers 78, 80, 82 and 86 are required in the structure according to FIG. 3b in which the coefficients used are indicated in the blocks. Since each of these multipliers comprises only few adders and delay stages in most applications, the arrangement shown in FIG. 8 can simply be formed as an integrated circuit, except for the translators 4 and 58 formed, for example as memories and except for the delay circuit 18. Because of the regular structure of adders and delay stages this integrated circuit may be implemented as a gate array.

Figure 9:
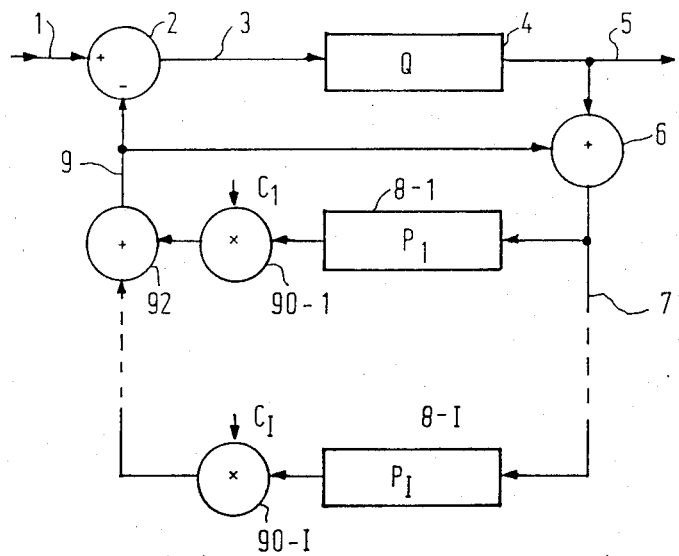
FIG. 9 shows the structure of an adaptive differential pulse code modulator of the prior art.
Figure 10:
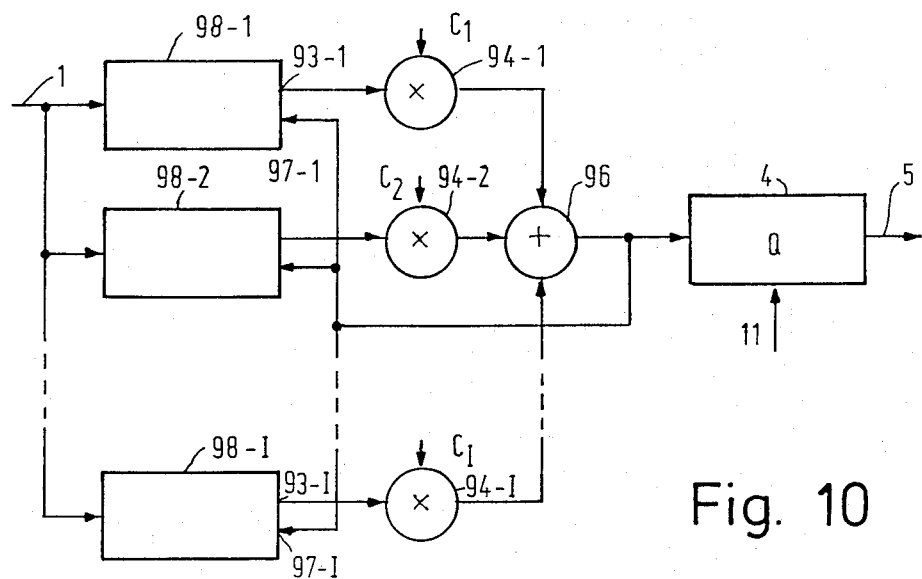
FIG. 10 shows the structure of an adaptive differential pulse code modulator in a system according to the invention.

For a reduction of information which is even more effective, it is known to use an adaptive differential pulse code modulator as is shown in FIG. 9. This modulator is essentially constructed in the same manner as the arrangement according to FIG. 1 but it uses a plurality of predictors 8-1 to 8-I all of which receive the same reconstructed signal via the lead 7 from the adder 6 but which determine different prediction samples due to the use of different coefficient series. These different prediction samples are applied to multipliers 90-1 to 90-I in which they are multiplied by weighting factors $C_1(n)$ to $C_I(n)$. These weighting factors $C_1(n)$ to $C_I(n)$ are determined in known manner and are therefore not further described because this is not essential for the further explanation of the invention. The weighted prediction samples generated at the outputs of these multipliers 90-1 to 90-I are summed at an output 9 of a summing stage 92 to form an overall prediction sample. Due to the slightly fundamental difference in structure of the differential pulse code modulator according to the invention in which a plurality of prediction sub-signals are generated within the predictor, the structure according to FIG. 9 cannot be used without further measures. A solution to this problem is shown in FIG. 10 which also uses a plurality of circuits 98-1, 98-2 to 98-I which are constructed similarly as the circuits in FIGS. 2 and 4 to 6 or 8 with a small modification of the connections. In fact, the prediction error signal e is supplied from the output of the differential stage 2 in FIG. 2 and at the output of the post-predictor, i.e. the delay stage 69 in FIGS. 4-6 and 8 via their own outputs 93-1 to 93-I and is applied to the multipliers 94-1 to 94-I in which these prediction error signals are multiplied by the weighting coefficients $C_1(n)$ to $C_I(n)$, for which it must hold that $$\sum_{i=1}^{I} C_i(n) = 1$$

The individual prediction error sub-signals are combined in a summing device 96 to an overall prediction error signal which is not only directly applied to the quantizer 4 but also to inputs 97-1 to 97-I of the circuits 98-1 to 98-I. These inputs are connected to the post-predictor 16 of FIG. 2 and to the translators with the memory 58 and possibly the further memories such as the memory 56 in FIGS. 4-6 and the memory 22 in FIG. 4. This means that for the prediction in each circuit, not only the input signals applied via the input 1 but also the overall prediction error signal at the output of the summing device 96 is used and that the prediction error sub-signal at the output 93 which is generated each time is not used.

However, since the multipliers 94 and the summing device 96 are now also located in the time-critical loop, very fast components are to be used for this purpose. In many cases, a particularly exact determination of the separate weighting factors $C_1(n)$ to $C_I(n)$ is not required, but they need only have the value zero or one, i.e. each time only one of the prediction error signals generated by the circuits 98-1 to 98-I is selected. Each of the multipliers 94-1 to 94-I can thereby be reduced to a simple switch and the summing device 96 can be reduced to a junction point or node, i.e. the circuit comprising the multipliers 94-1 and 94-I and the summing device 96 is replaced by a multiplexer which has no essential transit time delay. Additionally, or instead of the described adaptive prediction, the quantization characteristic of the quantizer 4 can be adapted via the control input 11, while a corresponding adaptation of the translators 56, 58 in the separate circuits 98-1 etc. is required, essentially with the same control signal example, when using memories for the quantizer and the translators, the memory range can be switched via the control input 11.

Figures 11, 12:
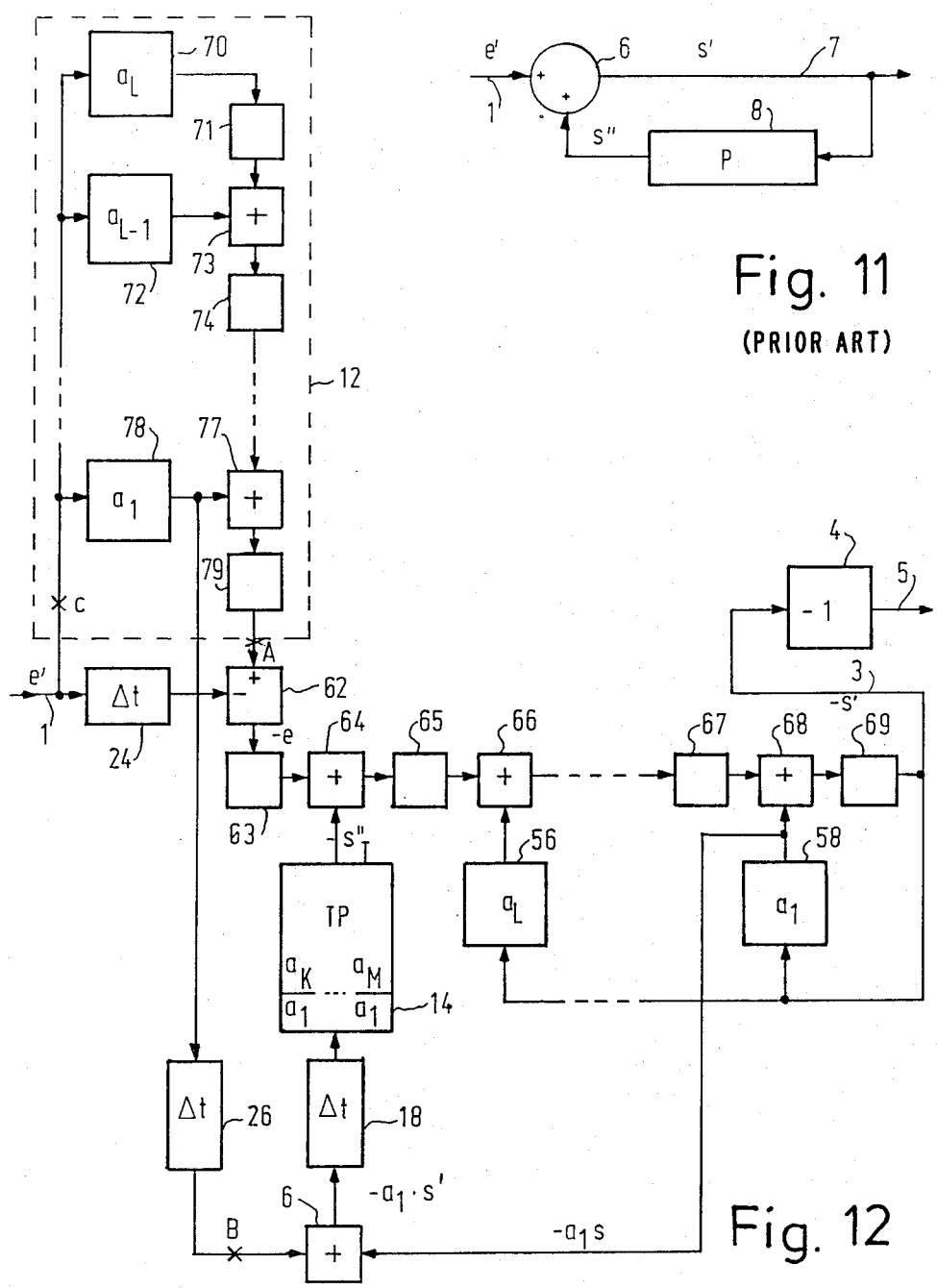
FIG. 11 shows the structure of a demodulator of the prior art.
FIG. 12 shows a first embodiment of a differential pulse code modulator in a system according to the invention, derived from a modulator according to FIG. 5.

For demosulation of the quantized prediction error signals e', i.e. for obtaining the reconstructed signals, a demodulation with the same predictor as in the modulator can be used, as is clearly evident from FIG. 1. The reconstructed signal s' is produced at the output of the adder 6 which receives the quantized prediction error signal e' and the prediction signal s'' generated in the predictor 8 from the reconstructed signal s'. This leads to a circuit which is shown in FIG. 11 and only comprises the adder 6 and the predictor 8. The quantized prediction error signal e' is applied via the input 1 and the reconstructed signal s' is derived from the output lead 7 of the adder 6.

In a corresponding manner, it is possible to use the circuits according to FIGS. 2 and 4–6 or 8 for the demodulator in the system in an essentially unchanged form, but only given connections must be separated therein and the inputs of given elements must constantly receive the value zero and the contents of the translators must be adapted to the memories 56 to 58. A possible embodiment of the demodulator according to the circuit of FIG. 5 is shown in FIG. 12. In this Figure the connections are interrupted at the locations A and B, i.e. the differential stage 62 constantly receives the zero signal at the upper, adding input and the adder 6 receives this signal at the left-hand input. At the location C, the connection may initially still be present.

The quantized prediction error signal e' applied to the input 1 and being initially formed at the transmission of coded prediction error signals and quantization stage numbers by a simple translation, which is not shown in this Figure, is applied via the delay circuit 24, which is not required for the function in this case, to the subtracting input of the differential stage 62. The negative quantized prediction error signal $-e'$ then occurs at the left-hand input of the adder 64. Assuming that the negative reconstructed signal $-s'$ occurs at the output of the lead 3, translator 58, performing a multiplication by the coefficient $a_1$ alone in this case, generates the signal $-a_1s'$ at the output, which signal is also applied to the right-hand input of the adder 6 and thus to the sub-predictor 14 so that the negative second prediction sub-signal $-s''_T$ is present at the lower input of the adder 64, which sub-signal is thus determined from the reconstructed signal s' while taking the coefficients $a_K$ to $a_M$ into account.

The sum formed in the adder 64 is now applied via the delay stage 65 to the series comprising the elements 66 to 69 in which the reconstructed signal $-s'$ is multiplied by the other coefficients $a_1$ to $a_L$ and is added to the applied sum. In this manner, the negative sum of the quantized prediction error signal e' applied to the input 1 and the previous reconstructed signal samples s' each time multiplied by all coefficients $a_1$ to $a_M$ is actually produced at the output of the delay stage 69, i.e. the reconstructed signal s' as shown in FIG. 11, though with a negative sign. This sign may, however, be reversed via the quantizer 4 which is also conventionally formed as a translator. In this manner, input and output are unchanged when using the circuit according to FIG. 5 as a demodulator but only a connection is each time interrupted at the locations A and B and the translators 56 to 58 and the quantizer 4 are correspondingly adapted as far as their content is concerned. Instead of the interruptions of the connections at the locations A and B, the connection at the location C may be interrupted by which the differential stage 62 constantly receives the zero signal at the upper input and the adder 6 receives this signal at the left-hand input. In a corresponding manner, the demodulator may alternatively be formed in accordance with the other circuits shown in FIG. 2 and FIG. 4 or 6 or 8.

Figure 13:
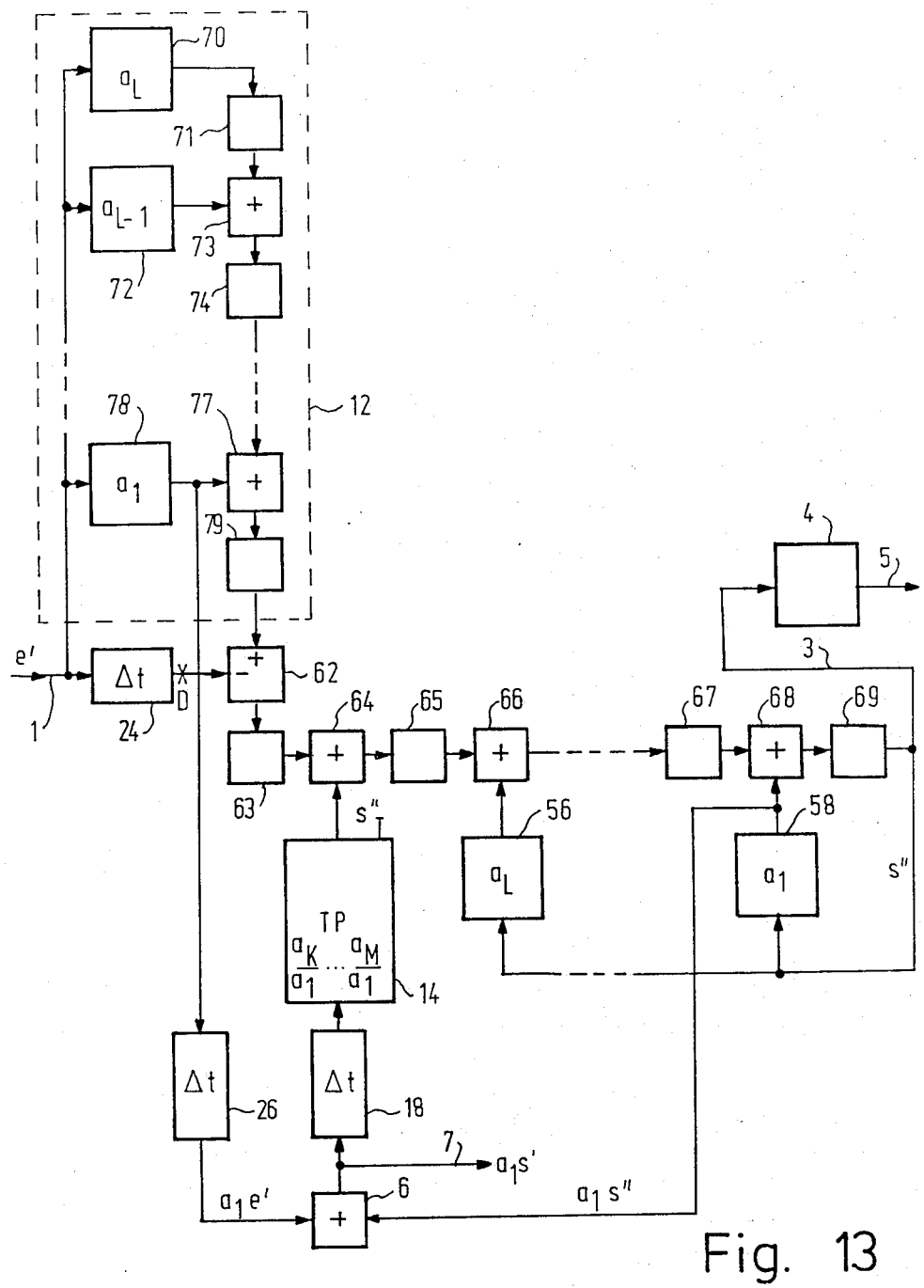
FIG. 13 shows a second embodiment of a differential pulse code modulator in a system according to FIG. 5.

A further embodiment of the demodulator resulting from the circuit according to FIG. 5 is shown in FIG. 13. In this Figure, it is achieved by the interruption at the location D at the output of the delay stage 24, which interruption may of course also be located at the input of this delay stage, that when supplying the quantized prediction error signal e' from the input 1, the reconstructed signal s', though with the coefficient $a_1$ as a constant factor, occurs on the output lead 7 of the adder 6, as this is also the case in the circuit according to FIG. 12. The reconstructed signal thus does not occur at the outputs 3 and 5 as is the case when using the circuit as a modulator.

The interruption at the location D corresponds to a division of the previously mentioned equation (7) for each prediction signal sample $$s''(n) = \sum_{m=1}^{M} a_m s'(n - m) \quad (7)$$

into two summands as is shown in equation (10)

$$s''(n) = \sum_{m=1}^{L} a_m s'(n - m) + \sum_{m=K}^{M} a_m s'(n - m) \quad (16)$$

Furthermore, the first partial sum is divided in accordance with the previously mentioned equation (2), while the second partial sum in accordance with the previously mentioned equation (15), represents the second prediction sub-signal $s''_T$ so that the following equation results for the prediction signal sample $s''(n)$ $$s''(n) = \sum_{m=1}^{L} a_m s''(n - m) + \sum_{m=1}^{L} a_m e'(n - m) + s''_T(n) \quad (17)$$

In the arrangement according to FIG. 13, the second prediction sub-signal again occurs at the output of the sub-predictor 14 while the middle term of the sum in equation (17) is formed in the pre-predictor 12 and the first term is formed in the post-predictor with the elements 66 to 69 in connection with the memories 56 to 58.

The constant factor $a_1$ in the reconstructed signal s' on the output lead 7 of the adder 6 normally poses no problems, particularly if this signal is used for controlling a picture display device.

The explanation of FIG. 12 also applies to the circuit according to FIG. 13, namely in that the demodulator may alternatively be formed by corresponding modification of the arrangements according to FIGS. 2, 4 or 6 or 8.

What is claimed is:

1. A differential encoder and decoder system for transmitting or storing input signals, comprising a differential pulse code modulator at an input end and receiving the input signals, applied to a system input in the form of a sequence of signal samples successively occurring at a first sampling rate, and supplying a quantized error signal sample from a modulator output at said first sampling rate each clock signal, and comprising a differential pulse code demodulator connected at an output end and receiving at a demodulator input the quantized error signal samples in the form of a sequence occurring at the first sampling rate and generating reconstructed signal samples and applying it to a system output, characterized in that the modulator comprises a differential stage which at the first sampling rate receives input signal samples s(n) at a first input, a quantizer which at the first sampling rate receives internally generated error signal samples (e(n)) and supplies quantized error signal samples (e'(n)), a pre-predictor, a sub-predictor and a post-predictor which are coupled to the differential stage and to the quantizer, the pre-predictor generating, at the first sampling rate, first sub-signal samples ($s''_V(n)$) from the multiplication of a first number (L) of input signal samples (s(n−1), ... s(n−L)) directly by an associated first number (L) of coefficieints ($a_1$, ... $A_L$) and the sub-predictor generating second sub-signal samples ($s''_T(n)$) from the multiplication of a second number (M−K+1) of reconstructed signal samples (s'(n−K), ... s(n−M)) by an associated second number (M−K+1) of coefficients ($a_K$... $a_M$), and in that in the post-predictor, which comprises a series-arrangement of a number, corresponding to the first number (L), of alternately a further adder and a delay stage having a delay time of one sampling period, the first of the further adders receives at an input the difference between an input signal sample (s(n)) and the sum of the two sub-signal samples ($s''_V(n)$, $s''_T(n)$) at least the second sub-signal sample of which ($s''_T(n)$) is shifted by a first delay circuit, and all further adders of the series arrangement receive at their inputs not connected to a delay stage the output signal from a translator which is directly controlled by the error signal sample (e(n)), and the last delay stage of the series arrangement supplies the error signal sample (e(n)), and in that the modulator comprises a first adder which receives at sampling rate at a first input the quantization error signal sample (q(n)) formed from the error signal sample (e(n)) in a further stage and the input signal sample (s(n)) temporally corresponding to the error signal sample (e(n)) at a second input via a second delay circuit having a delay time corresponding to the first number (L) of sampling periods, and supplies reconstructed signal samples (s'(n)), and in that the demodulator comprises at least one sub-predictor with an associated first delay circuit and one post-predictor constructed in conformity with the modulator and of which the post-predictor receives at least the sum of an output signal sample of the sub-predictor and a signal sample derived from the quantized error signal sample ($e'(n)$) at the demodulator input, and the sub-predictor receives a signal sample derived from the output of the post-predictor, while the reconstructed signal samples ($s'(n)$) can be derived from the output signal samples of the post-predictor.

2. A system as claimed in claim 1, characterized in that for forming the sum of the two sub-signal samples ($s''_V(n)$, $s''_T(n)$) and the difference with the input signal sample ($s(n)$), at least the modulator comprises an adder and a differential stage each time followed by a delay stage having a one sampling period delay, and supplying the relevant intermediate result or the final result, and in that the delay of the signals is taken into account by these delay stages in the delay period of the first and second delay circuits.

3. A system as claimed in claim 1, characterized in that at least the pre-predictor comprises a further series arrangement of alternately a further adder and a delay stage, the further adders of which receive the signal samples applied to the pre-predictor at their other inputs which are not used for the series arrangement, more specifically via multipliers which multiply a coefficient by a signal sample by means of successive shifted addition, while the overall delay is equal in each multiplier and in that the differential stage receives the input signal samples (s) via a third delay circuit whose delay time corresponds to the overall delay of each multiplier.

4. A system as claimed in claim 3, characterized in that also the sub-predictor is constructed in conformity with the pre-predictor, and in that the delay time of the first delay circuit arranged in series with the sub-predictor is selected to be shorter by an amount which equals the overall delay of the multipliers in the sub-predictor.

5. A system as claimed in claim 3, characterized in that an input of the first of the further adders in the pre-predictor receives the second subsignal samples ($s''_T(n)$) from the output of the sub-predictor, and in that the delay time of the first delay circuit is selected to be additionally shorter by an amount which equals the number of delay stages in the further series arrangement in the pre-predictor.

6. A system as claimed in claim 1, characterized in that the first input of the first adder receives the quantization error signal sample ($a_1 q(n)$) multiplied by a coefficient ($a_1$) from the translator (58) of the post-predictor and the second input of the first adder receives the input signal sample ($a_1 s(n)$) multiplied by the same coefficient ($a_1$) from the corresponding multiplier of the pre-predictor (12), and in that the sub-predictor performs multiplications by the second number of coefficients which are divided by the coefficients comprised in the signal samples of the first adder.

7. A system as claimed in claim 1, using adaptive prediction, characterized in that a plurality of individual differential pulse code modulators is provided, of which the output signal of the first series arrangement is applied, via multipliers for multiplication by individual weighting factors, whose sum equals 1, to the summing device (96) whose output signal represents the adaptive prediction error signal which is applied to the common quantizer and to the translators in each individual differential pulse code modulator.

8. A system as claimed in claim 7, characterized in that the multipliers and the summing device are replaced by an adaptively controlled multiplexer.

9. A system as claimed in claim 1, characterized in that the translators are switchable to adapt the quantization characteristic of the quantizer and the formation of the products.

10. A modulator for a system as claimed in claim 1 having an input for a sequence of input signal samples and an output for a sequence of quantized error signal samples, characterized in that the modulator comprises a differential stage (62) which at the sampling rate receives input signal samples ($s(n)$) at a first input, a quantizer (4) which at the sampling rate receives internally generated error signal samples ($e(n)$) and supplies the quantized error signal samples ($e'(n)$), a pre-predictor (12), a sub-predictor (14) and a post-predictor (16; 56, 58 66–69) which are coupled to the differential stage (62) and to the quantizer (4), the pre-predictor (12) generating first sub-signal samples ($2''_V(n)$) from the multiplication of a first number (L) of input signal samples ($s(n-1), \ldots s(n-L)$) directly by an associated first number (L) of coefficients ($a_1, \ldots, a_L$) and the sub-predictor (14) generating second sub-signal samples ($s''_T(n)$) from the multiplication of a second number ($M-K+1$) of reconstructed signal samples ($s'(n-K), \ldots, s(n-M)$ by an associated second number ($M-K+1$) of coefficients ($a_K, \ldots a_M$), and in that in the post-predictor (16) which comprises a series-arrangement of a number, corresponding to the first number (L), of alternately a further adder (66, 68) and a delay stage (69) having a delay time of one sampling period, the first (66) of the further adders (66, 68) receives at an input the difference between an input signal sample ($s(n)$) and the sum of the two sub-signal samples ($s''_V(n)$, $s''_T(n)$) at least the second sub-signal sample of which ($s''_T(n)$) is shifted by a first delay circuit (18) and all further adders (66, 68) of the series arrangement receive at their inputs not connected to the delay stage the output signal from a translator (56, 58) which is directly controlled by the error signal sample ($e(n)$) and the last delay stage (69) of the series arrangement supplies the error signal sample ($e(n)$), and in that the modulator comprises a first adder (6) which receives at sampling rate at a first input the quantization error signal sample ($q(n)$) formed from the error signal sample ($e(n)$) in a further stage (20, 22, 58) and the input signal sample ($s(n)$) temporally corresponding to the error signal sample ($e(n)$) at a second input via a second delay circuit (26) having a delay time corresponding to the first number (L) of sampling periods, and supplies reconstructed signal samples ($s'(n)$).

11. A demodulator for a system as claimed in claim 1 having an input for quantized error signal samples and an output for reconstructed signal samples, characterized in that it comprises at least a sub-predictor (14) with an associated first delay circuit (18), a post-predictor (56, 58, 66–69) and a summing stage (64), whilst inputs of the summing stage (64) are coupled to the input (1) of the demodulator and to an output of the sub-predictor (14) and an output of the summing stage (64) is coupled to an input of the post-predictor and an output of the post-predictor is coupled to an input of the sub-predictor (14) and to the output of the demodulator.

12. A demodulator for a system as claimed in claim 1 having an input for quantized error signal samples and an output for reconstructed signal samples, characterized in that it comprises at least a pre-predictor (12), a sub-predictor (14) with an associated first delay circuit (18), a post-predictor (56, 58, 66–69), a summing stage

(64) and an adder (6), whilst an input of the pre-predictor (12) is coupled to the input (1) of the demodulator, inputs of the summing stage (64) are coupled to a respective output of the pre-predictor (12) and of the post-predictor (14) and an output of the summing stage (64) is coupled to an input of the post-predictor, and inputs of the adder (6) are coupled to the input (1) of the demodulator and to an output of the post-predictor and an output of the adder (6) is coupled to an input of the sub-predictor (14) and to the output of the demodulator.

* * * * *